(12) United States Patent
Fanet (10) Patent No.: US 8,982,528 B2
(45) Date of Patent: Mar. 17, 2015

(54) LOW CONSUMPTION LOGIC CIRCUIT AND INTEGRATED CIRCUIT COMPRISING AT LEAST ONE SUCH LOGIC CIRCUIT

(75) Inventor: Hervé Fanet, Revel (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 73 days.

(21) Appl. No.: 13/554,373

(22) Filed: Jul. 20, 2012

(65) Prior Publication Data

US 2013/0021714 A1    Jan. 24, 2013

(30) Foreign Application Priority Data

Jul. 22, 2011    (FR) ...................................... 11 56670

(51) Int. Cl.
*H01G 5/00* (2006.01)
*H03K 19/00* (2006.01)
*H03K 19/02* (2006.01)

(52) U.S. Cl.
CPC ............ *H03K 19/0019* (2013.01); *H03K 19/02* (2013.01)
USPC .......................................... 361/211; 361/277

(58) Field of Classification Search
USPC .......................................... 361/211, 271, 277
See application file for complete search history.

(56) References Cited

U.S. PATENT DOCUMENTS

| | | | |
|---|---|---|---|
| 5,638,946 A | 6/1997 | Zavracky | |
| 6,153,839 A | 11/2000 | Zavracky et al. | |
| 7,190,092 B2 * | 3/2007 | Ivanciw et al. | 307/134 |
| 2002/0153583 A1 | 10/2002 | Frazier et al. | |
| 2002/0153584 A1 | 10/2002 | Frazier et al. | |
| 2005/0253571 A1 * | 11/2005 | Frank et al. | 324/76.11 |
| 2010/0072957 A1 * | 3/2010 | Bertin | 320/166 |

OTHER PUBLICATIONS

French Preliminary Search Report issued Mar. 8, 2012 in French Patent Application No. 1156670 (with English Translation of Categories of Cited Documents).
P. Bergstrom, et al., "Micromechanical Logic", IEDM 89, Dec. 3, 2009, pp. 878-879.
Michael P. Frank, "Reversible Computing and Truly Adiabatic Circuits: The Next Great Challenge for Digital Engineering", Design Applications, Workshop on Integration and Software, IEEE Dallas, Oct. 1, 2006, pp. 31-38.
William C. Athas, et al., "Low-Power Digital Systems Based on Adiabatic-Switching Principles", IEEE Transactions On Very Large Scale Integration Systems, vol. 2, No. 4, Dec. 1994, pp. 398-407.
Matthew Spencer, et al., "Demonstration of Integrated Micro-Electro-Mechanical Relay Circuits for VLSI Applications", IEEE Journal of Solid-State Circuits, vol. 46, No. 1, Jan. 2011, pp. 308-320.

(Continued)

*Primary Examiner* — Danny Nguyen
(74) *Attorney, Agent, or Firm* — Oblon, McClelland, Maier & Neustadt, L.L.P.

(57) ABSTRACT

Logic circuit for integrated circuit comprising a variable supply voltage source, the variation of which comprises at least three successive phases, a first phase of increasing the voltage from a zero value to a nominal voltage, a second phase of maintaining the supply voltage at the nominal voltage and a third phase of reducing the supply voltage from the nominal voltage to a zero value, and at least two mechanical switches, said switches being microelectromechanical switches or nanoelectromechanical switches, and means of switching said switches.

16 Claims, 5 Drawing Sheets

(56) References Cited

OTHER PUBLICATIONS

Adam Fruehling, et al., "Nano-switch for Study of Gold Contact Behavior", Purdue Libraries, Birck and NCN Publications, IEEE Sensors 2009 Conference, Paper 554, 2009, pp. 248-251 plus cover page.

J.G. Koller, et al., "Thermal Logic Circuits", IEEE, 1994, pp. 119-127.

Philip Teichmann, "Adiabatic Logic, Future Trend and System Level and Perspective", Springer Series in Advanced Microelectronics 34, Chapter 2, 2012 Edition, Oct. 29, 2011, 19 pages.

* cited by examiner

LOW CONSUMPTION LOGIC CIRCUIT AND INTEGRATED CIRCUIT COMPRISING AT LEAST ONE SUCH LOGIC CIRCUIT

TECHNICAL FIELD AND PRIOR ART

The present invention relates to a low consumption logic circuit and to integrated circuits comprising at least one such logic circuit.

Logic circuits of the prior art are produced in CMOS (Complementary Metal-Oxide Semiconductor) technology, which associates a pair of complementary transistors, one of N type, the other of P type, on a same support.

In particular due to the development of autonomous electronic systems, it is sought to control the consumption of integrated circuits in order to reduce said consumption. Several solutions may be implemented, one consisting in reducing the supply voltage of the circuits, indeed the consumption known as dynamic is proportional to the square of said voltage, the other solution consists in favoring the implementation of several circuits operating at relatively slow frequencies compared to a system operating at high frequency. However these solutions have limits due to the reduction in size of transistors.

There exists another solution called adiabatic logic, which consists in controlling in an optimal manner the charges and discharges of the capacitances of an integrated circuit, said capacitances being mainly those of the interconnecting lines, which are clearly superior to those of transistors. Adiabatic logic is described in the document of W C Athas, "*Low power digital systems based on adiabatic switching principles*", IEEE transactions on VLSI systems VOL 2, N04 December 1994.

Figures 1A, 1B:
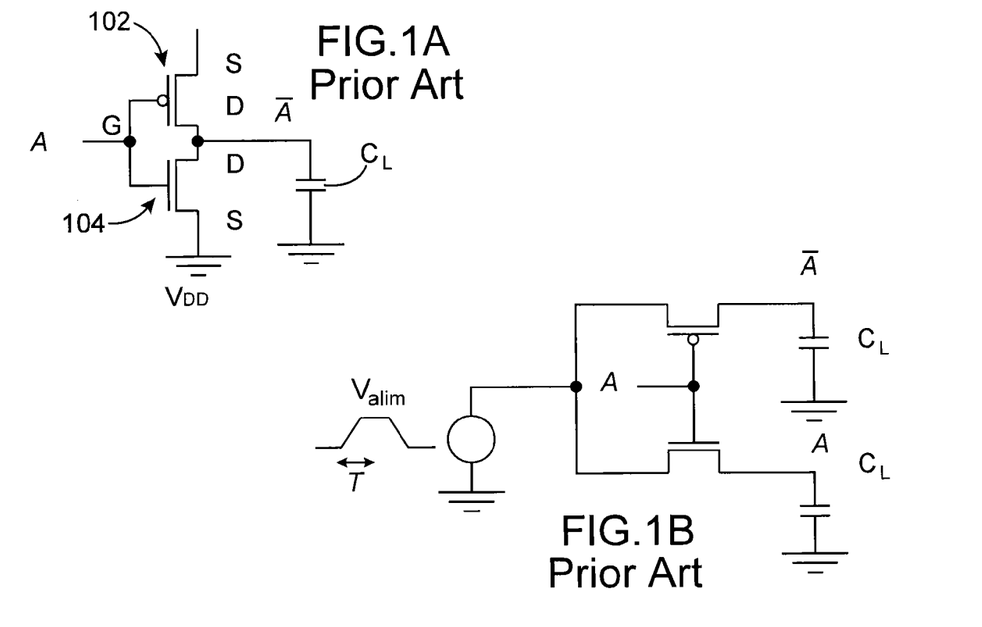
FIGS. 1A to 1D are logic gates of the prior art.
Figure 1C:
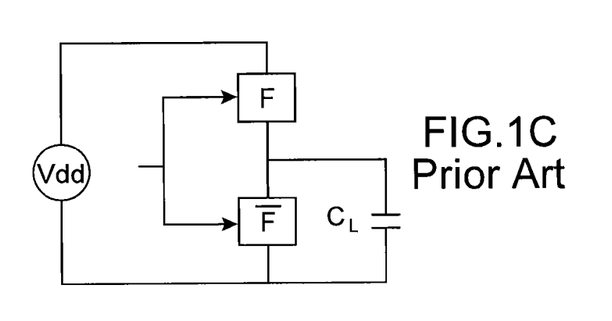

In FIG. 1A may be seen a logic inverter in conventional CMOS technology. The logic inverter comprises a p transistor and an n transistor 102, 104. G, S and D designate respectively the grid, the source and the drain of the transistors. A and its complement designates the control signals. In a more general manner, FIG. 1C shows how to produce any logic function as a function of the inputs, the associated circuit being a combination of transistors in series or in parallel. The inverter function is simply formed by a transistor, a PMOS for F and a NMOS for the complementary function.

In conventional logic, at each change of state, the capacitance $C_L$ of the interconnecting lines is charged to the supply voltage $V_{DD}$ then discharged to ground. An energy is thus dissipated thermally, which can be written for a cycle:

$$E = 2 \cdot \frac{1}{2} \cdot C_L \cdot V_{DD}^2$$

It may be shown in a theoretical manner that to minimise the energy dissipated by Joule effect in the resistance in series with a capacitance, it is necessary to guarantee that the charge and discharge operations take place at constant current. In this case, it is easy to show that the energy dissipated during time T, during which the capacitance is charged or discharged is written:

$$E = \frac{RC_L}{T} \cdot C_L \cdot V_{DD}^2$$

The resistance R is the sum of the resistances between the supply and the input of the interconnecting line (resistance of the switch used+resistances of the connecting lines). To establish this result, it suffices to resolve the system of equations:

$$Q = iT$$

$$Q = C_L V_{DD}$$

$$E = Ri^2 T$$

Q is the charge stored in the capacitance of the interconnecting line (in fact it is this capacitance plus the input capacitance of the following stage but in general much lower).

The constant charge and discharge current is i.

The voltage to be established on the interconnecting line is the supply voltage (the charge being assumed quasi-total).

T is the time during which the interconnecting line is charged or discharged.

In practice, to come close to this ideal condition, the circuits proposed until now are based on a linear variation of the supply voltage during the operations of charging and discharging the capacitances, which amounts to the first order to working at constant current. The case of the inverter makes it possible to specify this operating mode.

In adiabatic logic, in the case of the inverter represented in FIG. 1B, the supply voltage is no longer constant as in conventional logic, but is established relatively slowly at each change of state. The inputs are positioned then the supply voltage $V_{alim}$ is progressively taken to the nominal voltage $V_{DD}$ for a time T, which makes it possible to establish the output level then to transmit this level to the following gates. The opposite operation is then carried out to return the system to zero and treat another logic event. In the same way, the supply voltage $V_{alim}$ is then relatively slowly lowered from $V_{DD}$ to zero. The inputs are then also taken to zero potential while awaiting a new change of state.

Figure 1D:
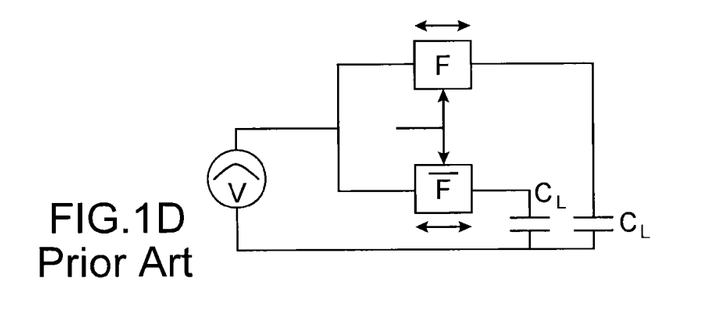

FIG. 1D represents a logic function equivalent to that of FIG. 1C produced in adiabatic logic.

Usually, adiabatic gates also perform the complementary function as is indicated in FIGS. 1A to 1D and as a result also use at input not only the logical variables but also their complements. This particular adiabatic logic is called "dual rail".

In so far as the capacitance $C_L$ is charged and discharged slowly compared to the typical time constant of the circuit $RC_L$, R being the overall resistance associated with the charge and discharge process, which includes the output resistance of the transistor(s) performing the functions F as well as the resistance of the connections, the voltage at the terminals of the capacitance $C_L$ can follow the voltage applied at input. The voltage at the terminals of the resistance is thus virtually zero and the thermal consumption may thus be reduced in a significant manner compared to conventional logic.

The energy dissipated during the charge may then be written as in the ideal case of the charge at constant current:

$$E = \frac{RC_L}{T} \cdot C_L \cdot V_{DD}^2$$

During the discharge an equivalent energy is dissipated.

Consequently, the energy dissipated in adiabatic logic may be reduced in a significant manner provided that the period T is very much greater than the time constants $RC_L$.

In practice, the trapeze form of the supply signal is often replaced by a sinusoidal or partly sinusoidal signal more easy to generate and constituting a suitable approximation.

This logic has not however given rise to any industrial realisation. In fact, the calculation exposed above ignores a characteristic of transistors produced in a technology based on semi-conductors, namely the threshold effect. To make the transistor (or the transistors) conductive in the charge or discharge phase of the capacitances, it is necessary that the control voltage applied to the grid exceeds a value called threshold voltage and noted $V_T$ in CMOS technology. In general, the control voltage and the supply voltage are of the same value to simplify the architecture. In the case of the inverter of FIG. 1B, when the input is at the state "0", the PMOS transistor becomes conductive when the supply voltage is greater than the threshold voltage of the transistor. In this case, a voltage difference is going to appear at the terminals of the resistance R in the charge (or discharge) process as long as the transistor is not conductive. This value varies from 0 to $V_T$ during the cycle. A non negligible current then appears at the terminals of the resistance and generates a thermal dissipation.

The energy dissipated in the charge process may be written as a first approximation:

$$E = \frac{RC_L}{T} \cdot C_L \cdot V_{DD}^2 + \frac{1}{2} C_L \cdot V_T^2$$

To reduce this negative effect it would be necessary to reduce the threshold voltage $V_T$ to a value close to 0, but in CMOS technology this solution is inapplicable because it would lead to an intolerable static consumption due to the current under the threshold. The static consumption is linked to the leakage current of the transistors (residual conduction below the threshold), it varies exponentially with the reduction of the threshold voltage and $V_T/V_{DD}$ ratios greater than 0.2 or even 0.3 in low consumption technologies are necessary.

Consequently, adiabatic logic, theoretically of considerable interest, is incapable of significantly reducing the consumption of circuits produced in a technology of switches based on semi-conductors, having threshold effects.

DESCRIPTION OF THE INVENTION

It is consequently the aim of the present invention to offer a logic circuit with very low energy consumption.

The aforementioned aim is attained by a logic circuit in adiabatic logic; i.e. supplied by a supply voltage source able to charge and discharge at quasi constant current an interconnecting line through mechanical switches, and implementing microelectromechanical switches or MEMS or nanoelectromechanical or NEMS instead of N and P transistors.

On the one hand, such mechanical switches do not have a threshold voltage in the sense of semi-conductors. When the contact is established, a very small value of the applied voltage is sufficient to make a current flow without having to overcome a threshold voltage. Moreover, they have a negligible static dissipation, contrary to transistors. Consequently, the energy dissipated is reduced compared to that dissipated by CMOS.

On the other hand, in a particularly interesting manner, the combination of mechanical switches with an electrostatic actuation and adiabatic logic makes it possible to obtain an integrated circuit in which the energy dissipated is to the first order independent of the supply voltage, which makes it possible to produce low consumption circuits without needing to implement very low supply voltages. The operating voltage may be chosen freely, which avoids having to work at very low voltages as in CMOS.

This effect is completely unexpected for those skilled in the art who generally associate low consumption with low supply voltage.

Thanks to the invention, in the case of ultra low consumption devices, it is no longer necessary to reduce the supply voltage, such a reduction having negative effects on reliability.

In the case of an integrated circuit that would implement one or more mechanical switches in conventional logic, the supply voltages would have to be lowered below 200 mV to be able to have an important advantage compared to CMOS integrated circuits. However, such supply voltages would impose clearances between the moving structure and the base of the switch of the order of several nanometers, which would imply very considerable technological production difficulties.

Thanks to the invention, such technological constraints are eliminated. A clearance comprised between 5 nm and 100 nm between the moving structure and the base in the switches may be implemented.

Although mechanical switches are considered by those skilled in the art in the field of integrated circuits as slow, having a high contact resistance in the case of switches of small dimensions and which are moreover capable of being subject to problems of sticking, the inventor of the present invention is going against the prejudices regarding mechanical switches by using them to produce logic gates in adiabatic logic and has obtained unexpected results from this combination. In particular, the independence to the first order of the energy dissipated compared to the supply voltage. It ensues that the supply voltage may be relatively high, which procures the unexpected advantage of resolving the problems of sticking, since said sticking is notably reduced when the applied voltage is low.

The present invention has the advantage of not being the seat of leakage current. In adiabatic logic, it is then possible to arbitrarily choose the operating frequency, which is impossible with MOS, since it is necessary to reach a static energy-dynamic energy compromise, which leads to an optimal operating frequency.

Moreover, mechanical switches do not have a threshold voltage, which leads to eliminating the non adiabatic residues in the dissipation, unlike MOS switches, which lead to terms dependent on the square of the threshold voltage.

The subject-matter of the present invention therefore is a logic circuit for integrated circuit comprising:
    a supply voltage source able to charge and discharge at quasi constant current an interconnecting line through mechanical switches:
    an interconnecting line,
    mechanical switches, said switches being microelectromechanical switches or nanoelectromechanical switches,
    means of switching said switches.

In an advantageous embodiment, the supply voltage source is variable according to at least three successive phases, a first phase of increasing the voltage from a zero value to a nominal voltage, a second phase of maintaining the supply voltage at the nominal voltage and a third phase of reducing the supply voltage from the nominal voltage to a zero value, and at least two mechanical switches, said switches being microelectromechanical switches or nanoelectromechanical switches, and means of switching said switches.

For example, each switch comprises two electric conductive tracks, one of which is connected to the supply voltage source and a moving part intended to come into contact with the two tracks in a state of closing of the switch, and the switching means implementing a control voltage for displacing the moving part.

In a preferred manner, the switching means are of electrostatic type and comprise a fixed electrode facing a part at least of the moving part and means of applying the positive control voltage to attract the moving part towards the fixed electrode and place in contact the moving part with the conductive tracks.

Advantageously, the supply voltage is equal to the control voltage.

For example, the duration of the first phase is comprised between 1 and 100 ns, and the nominal supply voltage may be comprised between 100 mV and 10 V.

In a variant, the switching means are of magnetic, piezoelectric type.

The logic circuit according to the invention may be a logic inverter or a NOR or NAND or AND or OR circuit or a Toffoli gate or a Fredkin gate or a Feynman gate.

The subject-matter of the present invention is also an integrated circuit comprising at least a first and a second logic circuit according to the present invention.

In an embodiment, the output voltage of the first gate controls the second gate.

BRIEF DESCRIPTION OF DRAWINGS

The present invention will be better understood on reading the description that follows and by referring to the appended drawings in which.

DETAILED DESCRIPTION OF PARTICULAR EMBODIMENTS

Figure 2:
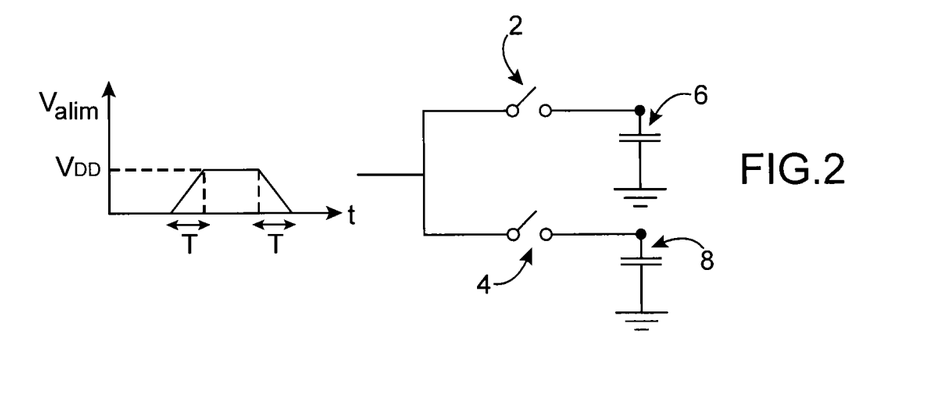
FIG. 2 is an example of logic inverter according to the present invention.
Figure 3A:
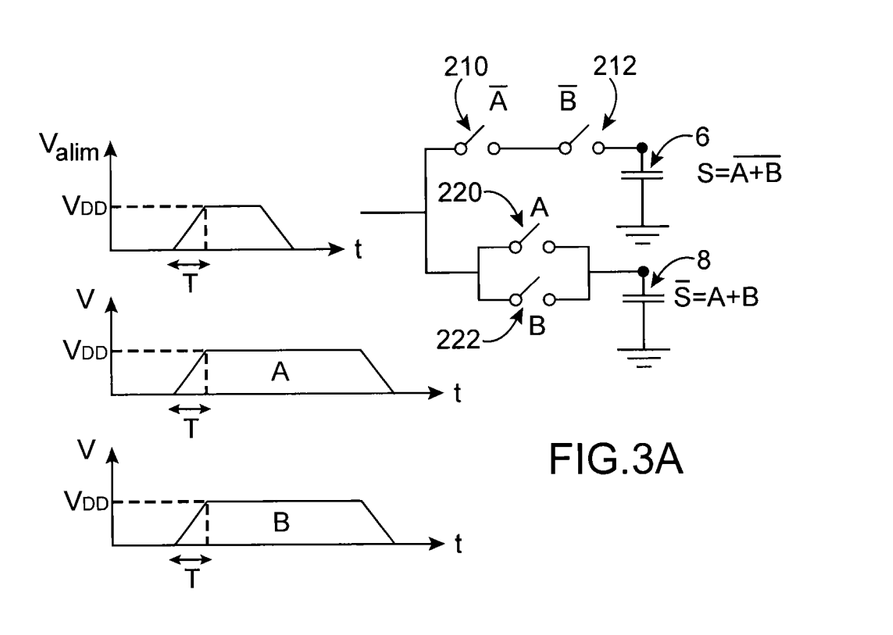
FIGS. 3A, 3B and 3C are examples of NOR and NAND logic gates according to the present invention.
Figure 3B:
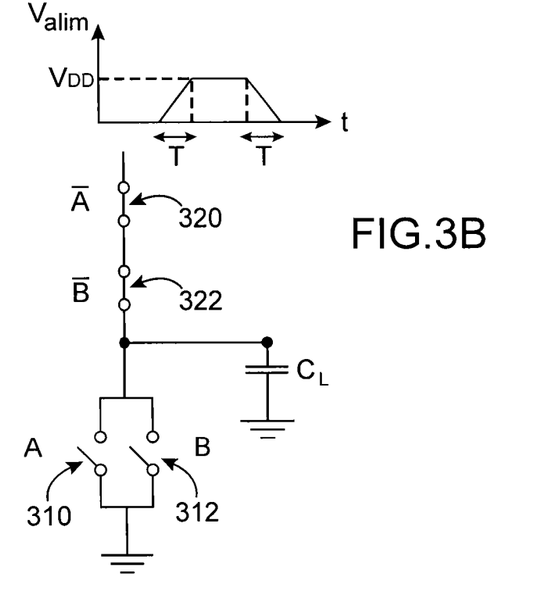
Figure 3C:
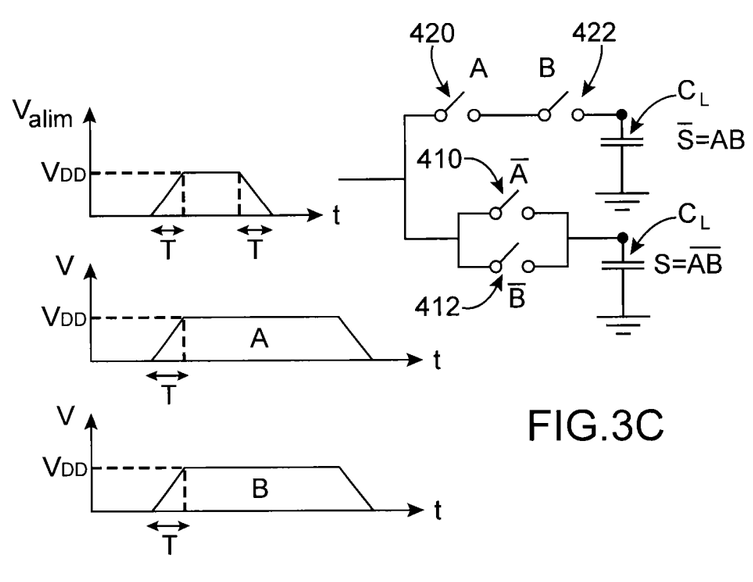

In FIGS. 2 and 3 may be seen two examples of logic gates according to the present invention. In FIG. 2 it is a logic inverter and in FIG. 3A it is an example of a NOR gate. In FIG. 3B may be seen another example of NOR gate and in FIG. 3C may be seen an example of embodiment of NAND gate.

Said logic gates comprise, instead of transistors, mechanical switches, more particularly nanoswitches or microswitches produced by NEMS (Nanoelectromechanical Systems) or MEMS (Microelectromechanical Systems) technology. The closing and sometimes the opening of said switches may be controlled by electrostatic means, by application of a magnetic field, by piezoelectric effect, by thermal effect, etc.

For reasons of simplicity, "nano and microswitches" will be designated uniquely by "mechanical switches".

On the circuit of FIG. 2 are shown schematically the two mechanical switches 2, 4, one of them 2 performing the function F and the other 4 performing the complementary function $\overline{F}$.

The capacitors 6, 8 of capacitance $C_L$ symbolise the capacitances of the interconnecting lines.

The supply voltage designated $V_{alim}$ is applied at input of the two mechanical switches 2, 4.

In the case of switches with electrostatic control, a control voltage V assures the closing of the switches 2, 4.

According to the invention, the gate of FIG. 2 functions in adiabatic logic, i.e. the supply voltage source is such that it makes it possible to charge and discharge at quasi constant current an interconnecting line through the mechanical switches.

For example, the voltage supply source is such that the supply voltage $V_{alim}$ is not constant and varies according to a trapezoidal profile. The variation in the voltage $V_{alim}$ is represented schematically in FIGS. 2 and 3. In a first phase I, the supply voltage rises progressively from 0 until it reaches the nominal voltage $V_{DD}$, during a time T, which makes it possible to establish the output level then to transmit the level to the following gates. In a second phase II, the supply voltage $V_{alim}$ is maintained for a certain time at the nominal voltage $V_{DD}$ and then, during a third phase III, the supply voltage $V_{alim}$ decreases during the time T to return the system to zero and treat another logic event. The inputs are then also taken to zero potential while awaiting a new change of state.

The time of increasing the voltage and the time of reducing the voltage are preferably substantially equal. Moreover, the time during which the voltage is constant is substantially constant. In practice, the trapezoidal profile is approximated by a demi-sinusoid.

In adiabatic logic, also called "energy recovery logic", the energy stored in the capacitance of the interconnection is not discharged to ground as in CMOS logic, which necessarily introduces a dissipation, but to the supply that has served to charge it. A large part of the energy is thus recovered by the supply. Adiabatic logic is also called energy recovery logic.

Figure 4:
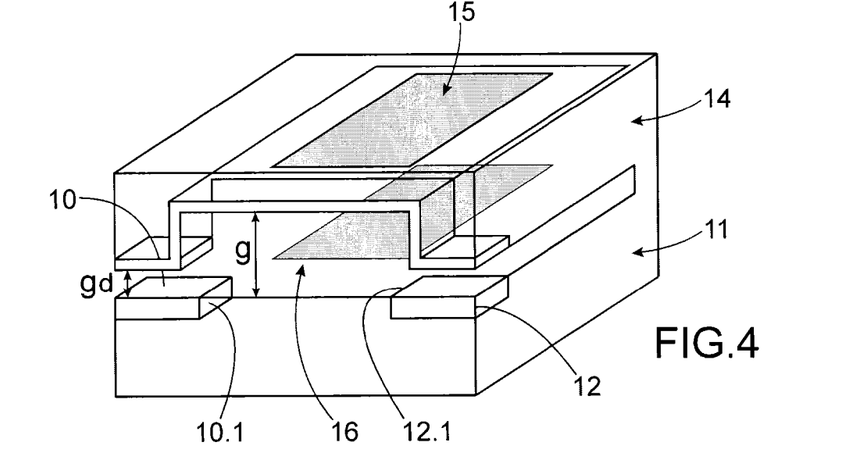
FIG. 4 is a complete view of a schematic representation of a mechanical switch that can be implemented in the present invention.

In FIG. 4 may be seen, in top view, an example of embodiment of a mechanical switch 2 adapted to the present invention.

The switch is intended to electrically connect two tracks 10, 12 formed on the surface of the integrated circuit, the switch comprises a means of connection formed by a moving part 14 provided with a control electrode 15 arranged above two tracks 10, 12 and a fixed electrode 16 on the fixed part 11 of the integrated circuit and a part of which at least is facing the moving part 14. In the example represented, the moving part 14 is of cantilever type. It could be formed by a membrane.

In the example represented, the two tracks 10, 12 are aligned and comprise two free ends 10.1, 12.1 respectively facing, the fixed electrode 16 is situated between the free ends 10.1, 12.1 of the two tracks 10, 12, and the moving part 14 overlaps the two ends 10.1, 12.1 of the tracks 10, 12 and is perpendicular to the fixed electrode.

The moving part 14 is, in the absence of applied positive voltage, between the moving part 14 and the fixed electrode 16 maintained suspended above the tracks by beam type elastic elements. When a sufficient control voltage is applied, the moving part comes closer to the tracks under the effect of the electric force and enters into contact with them so as to assure the electrical connection therewith. For example, the moving part is of the cantilever type.

Figure 5A:
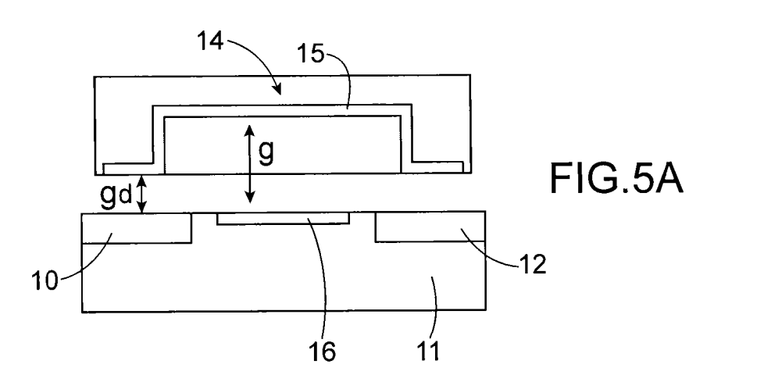
FIGS. 5A and 5B are side views of the switch of FIG. 4 in a closed state and in an open state respectively.
Figure 5B:
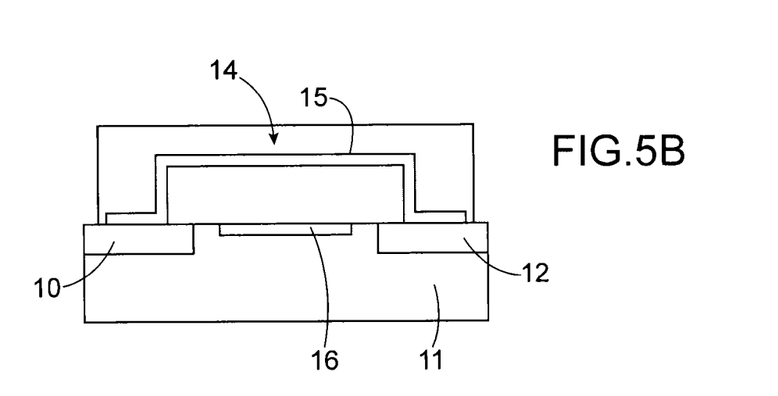

In FIG. 5A may be seen from the side the switch of FIG. 4, in an open state (logic state 2), in the absence of a positive control voltage applied between the fixed electrode and the moving part and in FIG. 5B, the switch is in a closed state (logic state 1) by application of a positive control voltage between the fixed electrode 16 and the moving part 14, the two tracks 10, 11 are connected and the current can flow between the two tracks 10, 12.

The switch structure represented in FIGS. 4, 5A and 5B is only an example of embodiment and is in no way limiting.

Figure 6A:
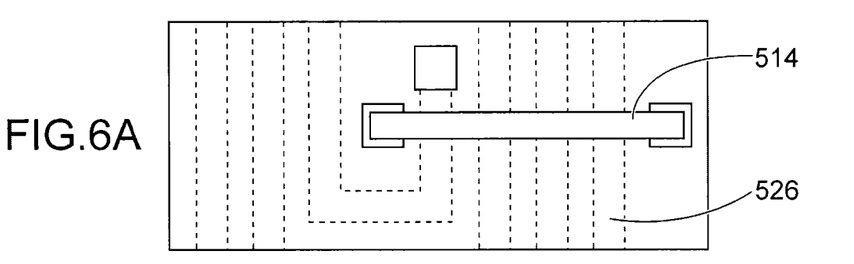
FIGS. 6A and 6B are top and sectional views of an example of embodiment of a mechanical switch with magnetic control that can be used in the present invention.
Figure 6B:
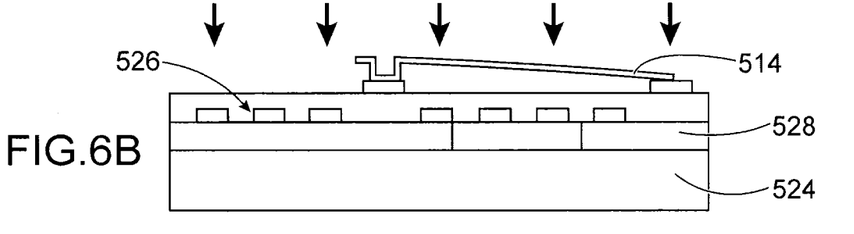

A switch with magnetic actuation is represented in FIGS. 6A and 6B, this comprises a moving part 514 of cantilever type and the control means are formed by a permanent magnet 524 and a coil 526 separated by a substrate 528.

Figure 7A:
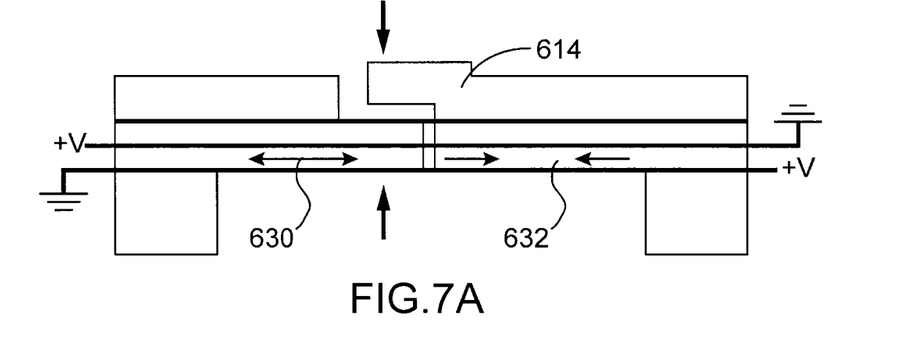
FIGS. 7A and 7B are longitudinal sectional views of an example of embodiment of a mechanical switch with piezoelectric control that can be used in the present invention, in a state in the course of closing and in an open state respectively.
Figure 7B:
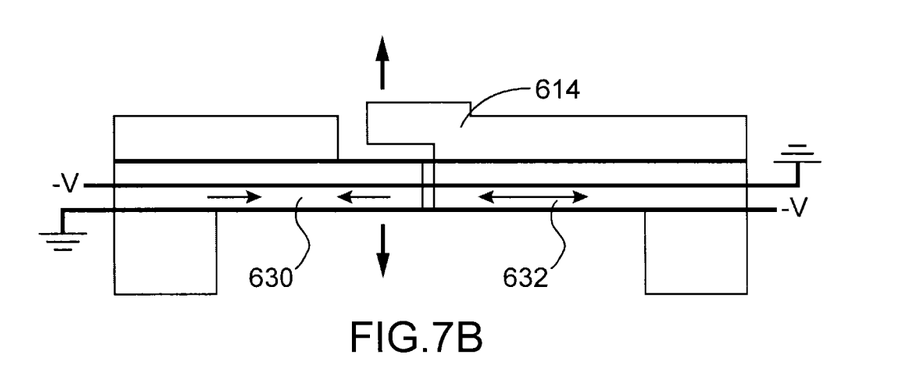

In FIGS. 7A and 7B may be seen an example of embodiment of a switch with piezoelectric control. The moving part 614 is also of cantilever type, this comprises two portions 630, 632 of piezoelectric material, for example AlN, in which the application of a positive voltage V causes for one an expansion 630 in the plane and for the other 632 a contraction, closing the switch, and conversely the application of a negative voltage V causes for one 630 a contraction and for the other an expansion 632, opening the switch.

The switch structures represented in FIGS. 6A to 7B are examples of embodiments and are in no way limiting.

In FIGS. 3A and 3B may be seen examples of embodiments of NOR gates according to the present invention. In FIG. 3A, the gate comprises two branches supplied in parallel by $V_{alim}$, one comprising two switches in series 210, 212 and the other comprising two switches in parallel 220, 222. Each branch is charged by its own capacitance $C_L$. A capacitance $C_L$ is provided between the two switches in series and the switches in parallel. The voltages V at the terminals of A and B are also represented.

The switches may be similar to those represented in FIGS. 4, 5A and 5B.

In FIG. 3B, the gate comprises two switches 310, 312 in parallel performing the controls A and B, in series with two switches in parallel 320, 322 performing the complemented controls and B. The voltage source is connected to the switches 310, 312. A capacitance $C_L$ is provided between the two switches in series and the switches in parallel. When the switches 310 and 312 are open, the switches 320 and 322 are closed. The complemented control A and the complemented control B may be replaced by the controls A and B with different switches, i.e. closed without application of control voltage and opened by application of a control voltage.

In FIG. 3C may be seen an example of NAN gate according to the present invention implementing four mechanical switches 410, 412, 420, 422. The voltages V at the terminals of A and B are also represented.

Preferably, all of the switches of a same logic circuit are similar or identical in order to simplify the production and the control of the circuit.

We are now going to determine the energy dissipated for a mechanical switch with electrostatic control and in the case of a logic inverter according to the present invention.

The inverter according to the present invention consumes energy uniquely during switchings, this consumption is designated dynamic consumption, the static consumption thereof being negligible.

In fact, the mechanical contact being established by positioning of the inputs, the switch is conductive whatever the value of voltage applied between the two conductive tracks 10, 12 and a voltage however small is transmitted between the input and the output.

The current flowing between the two tracks is independent of the control voltage value, unlike a CMOS switch in which the current between the source and the drain depends on the threshold voltage value. The closing of the mechanical switch is effective from a certain control voltage value, however this is not comparable to the threshold voltage of a MOS transistor because its value does not intervene on the current value that flows through the switch and thus does not introduce any non adiabatic dynamic consumption. In addition, since the control electrode is electrically isolated, there is no static consumption.

The energy dissipated may then be written:

$$E_{meca} = \frac{R_{meca} C_L}{T} \cdot C_L \cdot V_{DD}^2 \qquad (I)$$

With $C_L$ the capacitance of the interconnections,
$R_{meca}$ the electrical resistance of the interconnections and contacts.

By way of comparison, the switching energy of an MOS based adiabatic inverter is:

$$E_{MOS} = \frac{R_{mos} C_L}{T} \cdot C_L \cdot V_{DD}^2 + C_L \cdot V_T^2 \qquad (II)$$

Assuming that the period T is chosen so that the first term of the expression (II) in the case of a CMOS inverter is negligible, one may compare:

$$E_{meca} = \frac{R_{meca} C_L}{T} \cdot C_L \cdot V_{DD}^2 \text{ and } E_{mos} = C_L \cdot V_T^2$$

For example, $R_{meca}$ may be as low as 1000 Ohms for a voltage $V_{DD}$ of 1 V.

The time T of raising the polarisation signal may be chosen at 10 ns.

The typical capacitance of the connecting line is 10 fF.

The threshold voltage of an advanced low consumption CMOS technology is of the order of 300 mV.

The two energies are then $C_L \cdot V_T^2$ for CMOS and $10^{-3} C_L \cdot V_{DD}^2$ for the NEMS solution.

As has been explained previously, the threshold voltage of CMOS technology cannot be reduced due to the static consumption and since it is possible to envisage voltages of several volts for the supply voltage $V_{DD}$, it may be noted that the logic circuit according to the invention makes it possible to reduce the energy dissipated by a factor of the order of 100 compared to a logic circuit in advanced CMOS technology.

For example, taking typical values of 300 mV for the threshold voltage and 1 V for the supply voltage of the logic circuit according to the invention, a factor 100 is obtained.

This factor would be between 100 and 1000 for a time T of 100 ns.

Consequently, thanks to the invention, a low consumption logic circuit is obtained.

Moreover, thanks to the combination of an operation in adiabatic logic and of mechanical switches according to the invention, it is possible to produce low consumption integrated systems without having to use low supply voltages. Being able to use relatively high voltages (of the order of a volt) is a major advantage because circuits operating at low voltage (100 mV or less) are particularly sensitive to electrical perturbations. The fact of having the switching energy quasi independent of the voltage used gives a large flexibility to the design of electronic systems. In addition, the possibility of varying the supply voltage in a vast range enables an easier optimisation of the mechanical switches, for example by eliminating more easily the problems of sticking or problems of electrical breakdown.

As indicated above, a high supply voltage makes it possible moreover to resolve the problem of the sticking of mechanical switches.

In the case of electrostatic actuation, the force F applied between the moving part and the fixed electrode when the contact is established is written:

$$F = \frac{\varepsilon_0 \cdot S \cdot V^2}{2(g - g_d)^2}$$

The contact resistance is conventionally calculated by the Sharvin formula:

$$R = 2\frac{4\rho\lambda}{3A}$$

V is the control voltage of the switches of the inverter,
R is the contact resistance between the moving part and the tracks,
ρ is the resistivity of the metal used in the moving part,
S is the surface facing the fixed electrode (noted 16 in FIG. 5A) and the corresponding electrode for the moving part,
λ is the average free path of the electrons in the metal,
A is the contact surface between the moving part and the tracks,
g is the clearance in the open state between the moving part and the fixed electrode (represented in FIG. 5A),
$g_d$ is the clearance, in the open state, between the moving part and the base at the level of the zones intended to enter into contact (represented in FIG. 5A).

Moreover, the contact surface A may be calculated as follows:

$$A = \frac{F}{H\xi}$$

H being the hardness of the metal
ξ being the elasticity coefficient of the order of 0.3.

In a preferential manner, the control voltage V is also the output or nominal supply voltage, its value is thus $V_{DD}$, which makes it possible to simplify the architecture of the integrated circuit as a whole, since one logic gate controls another. If not, the output voltage of a logic gate would be transformed in order that it forms a control voltage of another logic gate.

The switching energy in adiabatic logic for a stage gate is then, assuming that the contact resistances are the main contributions to the total resistance, which is confirmed by the literature:

$$E = \frac{32}{3}\frac{\rho\lambda H\xi}{\varepsilon_0 S}(g - g_d)^2\frac{C_L^2}{T}$$

It is thus noted in a very surprising manner that the energy dissipated is independent of the control voltage and thus of the nominal supply voltage, contrary to the prejudices of those skilled in the art who generally consider that a low consumption imposes a low supply voltage.

The preceding demonstration applies in the case of electrostatic control switches. For other types of control, there is also a compensating effect of the same type. In fact, the contact resistance depends on the actuation and thus on the control voltage, but not necessarily according to a law inversely proportional to the square of the voltage as in the electrostatic control switch.

The time taken by the structure to enter into contact with the substrate when a voltage is applied can also be calculated as a function of the applied voltage and the characteristics of the switch. This time should be less than the time T chosen in conventional logic architectures and thus should be of several nanoseconds if T is 10 ns. The miniaturisation of mechanical switches could lead to such values. In all cases, logic architectures more adapted to mechanical switches make it possible however to become free of this constraint for example by producing more complex logic functions at the level of elementary gates.

It is then possible to calculate the ratio between the energy dissipated in a circuit based on transistors in adiabatic logic and that dissipated in a circuit according to the invention, which represents the figure of merit of the invention compared to existing circuits.

Said factor is written:

$$\eta = \frac{3}{32}\frac{V_T^2 \varepsilon_0 S}{\rho\lambda H\xi(g - g_d)^2}\frac{T}{C_L}$$

It may be noted that the present invention has as much interest when T increases and $C_L$ diminishes.

T is advantageously comprised between 1 and 100 ns.

The figure of merit of the invention may be written for typical values of the physical constants brought into play:

$$\eta = 2 \cdot 10^{-6}\frac{V_T^2}{C_L}TF$$

The shape factor of the mechanical switch is defined by:

$$F = \frac{S}{(g - g_d)^2}$$

This relation gives the area of applicability of the invention. A figure of merit greater than 100 is sought for a given form factor, 1000 for example.

Typical values of 10 fF for the capacitance, 10 ns for T and 200 mV for the threshold voltage of the MOS circuit lead to values of the order of:

$$\eta = 8 \cdot 10^{-2} F$$

To obtain a significant gain of 80, the form factor is of 1000. A switch of 10 nm gap with an electrostatic control surface of 300 nm×300 nm would be compatible, which leads to a reasonable size.

Let us return to the theoretical value of the energy dissipated for an electrostatic actuation.

$$E = \frac{32}{3} \frac{\rho \lambda H \xi}{\varepsilon_0 S} (g - g_d)^2 \frac{C_L^2}{T}$$

For an interconnection capacitance of 10, $10^{-15}$ F and for a value of T equal to 10 ns, one obtains for metal layer devices by expressing the energy in kTa as is frequent in the low consumption field.

$$E = 0,75 \cdot \frac{10^6}{F} kT_a$$

k being the Boltzmann constant.

Ta being the absolute temperature in Kelvin.

A value of 750 kTa is thus possible for F equal to 1000, which is exceptional compared to CMOS.

This value would be 75 kTa for a value of T of 100 ns.

The examples of logic gates represented in FIGS. 2 and 3 are in no way limiting and apply to any type of logic gate architecture. The NOR gate has been given as example but conventional NAND, AND and OR gates are also realisable according to this principle. The same is true for the functions obtained by combination of elementary gates (adders, registers, SRAM or DRAM memory cells). It should also be noted that the gates used in reversible calculation (Fredkin, Toffoli and Feynman gates) are also realisable according to this principle.

The logic circuits thereby produced are particularly adapted to applications requiring very low consumption, for example portable autonomous systems.

The present invention is also particularly adapted to systems with a high degree of "parallelisation", i.e. systems comprising a large number of circuits operating at relatively slow frequencies, thus requiring quite low operating frequencies per block.

The circuits according to the present invention may be produced by conventional microelectronics technologies used to produce MEMS or NEMS systems, for example by silicon technology, by layer deposition and etching, but any other technology making it possible to produce miniaturised mechanical switches is applicable.

The invention claimed is:

1. A logic circuit for an integrated circuit, comprising:
a supply voltage source configured to charge and discharge at quasi constant current an interconnecting line through mechanical switches;
said interconnecting line;
said mechanical switches, said switches being microelectromechanical switches or nanoelectromechanical switches, each of said mechanical switches having an open state and a closed state; and
a device for switching said switches,
wherein said switches are configured to produce logic gates in adiabatic logic, and
wherein each of said switches has two components that contact each other in the closed state.

2. The logic circuit according to claim 1, in which the supply voltage source is variable according to at least three phases successive, a first phase of increasing the voltage from a zero value to a nominal voltage, a second phase of maintaining the supply voltage at the nominal voltage, and a third phase of reducing the supply voltage from the nominal voltage to a zero value.

3. The logic circuit according to claim 2, in which the duration of the first phase is comprised between 1 and 100 ns.

4. The logic circuit according to claim 2, in which the nominal supply voltage is comprised between 100 mV and 10 V.

5. The logic circuit according to claim 1, in which each of said switches comprises two electric conductive tracks, one of the conductive tracks being connected to the supply voltage source and a moving part configured to come into contact with the two tracks in said closed state, and in which the device for switching implements a control voltage for displacing the moving part.

6. The logic circuit according to claim 5, in which the supply voltage is equal to the control voltage.

7. The logic circuit according to claim 5, in which the device for switching is an electrostatic type and comprises a fixed electrode facing a part at least of the moving part, and the device for switching is configured to apply a positive control voltage to attract the moving part towards the fixed electrode and to place in contact the moving part with the conductive tracks.

8. The logic circuit according to claim 5, in which the device for switching is magnetic.

9. The logic circuit according to claim 5, in which the device for switching is piezoelectric.

10. The logic circuit according to claim 1, in which the logic circuit is a logic inverter.

11. The logic circuit according to claim 1, in which the logic circuit is a NOR or NAND or AND or OR circuit or a Toffoli gate or a Fredkin gate or a Feynman gate.

12. An integrated circuit comprising at least a first logic circuit and a second logic circuit, each logic circuit comprising:
a supply voltage source able to charge and discharge at quasi constant current an interconnecting line through mechanical switches;
said interconnecting line;
said mechanical switches, said switches being microelectromechanical switches or nanoelectromechanical switches, each of said mechanical switches having an open state and a closed state; and
a device for switching said switches,
wherein said switches are configured to produce logic gates in adiabatic logic, and
wherein each of said switches has two components that contact each other in the closed state.

13. The integrated circuit according to claim 12, in which the supply voltage is equal to a control voltage of said device, and an output voltage of a first gate of said logic gates controls a second gate of said logic gates.

14. The logic circuit according to claim 2, wherein the three phases approximate a signal having at least one of a sinusoidal profile, a partly-sinusoidal profile, a trapezoidal profile, or a profile that approximates a trapezoidal profile.

15. The logic circuit according to claim 1, wherein said logic gates are further configured to produce low consumption integrated systems without having to use low supply voltages.

16. The integrated circuit according to claim 12, wherein said logic gates are further configured to produce low consumption integrated systems without having to use low supply voltages.

* * * * *